(12) United States Patent
Low et al.

(10) Patent No.: US 11,056,457 B2
(45) Date of Patent: Jul. 6, 2021

(54) SEMICONDUCTOR DEVICE WITH BOND WIRE REINFORCEMENT STRUCTURE

(71) Applicant: NXP USA, INC., Austin, TX (US)

(72) Inventors: Boon Yew Low, Subang Jaya (MY); Lan Chu Tan, Singapore (SG); Wai Yew Lo, Petaling Jaya (MY); Poh Leng Eu, Petaling Jaya (MY); Chin Teck Siong, Sungai Buloh (MY)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/145,203

(22) Filed: Sep. 28, 2018

(65) Prior Publication Data

US 2020/0105709 A1    Apr. 2, 2020

(51) Int. Cl.
  *H01L 23/00* (2006.01)
  *H01L 25/065* (2006.01)
  *H01L 21/56* (2006.01)
  *H01L 23/495* (2006.01)

(52) U.S. Cl.
  CPC ............ *H01L 24/73* (2013.01); *H01L 21/565* (2013.01); *H01L 23/49582* (2013.01); *H01L 24/09* (2013.01); *H01L 24/85* (2013.01); *H01L 25/0657* (2013.01)

(58) Field of Classification Search
  CPC ................................................. H01L 24/42–49
  See application file for complete search history.

(56) References Cited

U.S. PATENT DOCUMENTS

| | | | |
|---|---|---|---|
| 5,097,317 A * | 3/1992 | Fujimoto | C08K 3/08 257/786 |
| 5,310,702 A | 5/1994 | Yoshida et al. | |
| 5,331,205 A | 7/1994 | Primeaux | |
| 6,340,846 B1 | 1/2002 | LoBianco et al. | |
| 6,852,567 B1 | 2/2005 | Lee et al. | |
| 6,955,949 B2 | 10/2005 | Batish et al. | |
| 7,541,222 B2 | 6/2009 | Magno et al. | |
| 8,912,667 B2 | 12/2014 | Wenzel et al. | |
| 2007/0096342 A1 | 5/2007 | Batish | |
| 2009/0001599 A1 | 1/2009 | Foong et al. | |
| 2009/0032972 A1* | 2/2009 | Okubo | H01L 23/3121 257/777 |
| 2016/0215168 A1* | 7/2016 | Oda | H01L 23/49562 |
| 2016/0260685 A1* | 9/2016 | Tremlett | H01L 21/56 |

* cited by examiner

*Primary Examiner* — Stephen M Bradley

(57) ABSTRACT

A packaged semiconductor device includes a substrate having input/output (I/O) pads, a semiconductor die attached to the substrate and electrically connected to the substrate with bond wires. A bond-wire reinforcement structure is formed over the bond wires before the assembly is covered with a molding compound. The bond-wire reinforcement structure prevents wire sweep during molding and protects the wires from shorting with other wires. In one embodiment, the bond-wire reinforcement structure is formed with a fiberglass and liquid epoxy mixture.

15 Claims, 2 Drawing Sheets

SEMICONDUCTOR DEVICE WITH BOND WIRE REINFORCEMENT STRUCTURE

BACKGROUND

The present invention relates to integrated circuit (IC) packaging and, more particularly, to a packaged IC with a structure that prevents bond wires from moving during a molding process.

Semiconductor dies are becoming more and more complex, with more circuitry being integrated onto a die. With more internal circuitry, there is a need for more inputs and outputs (I/Os). To enable packages that use wire-bond dies and have more I/Os, there is a need for finer pitch or multi-row bond pads and/or smaller wire diameter to prevent the package size from increasing.

One issue with using bond wires is ensuring that the bond wires do not touch each other, creating short circuit conditions. Another issue is preventing long wires from sagging so that the wires do not touch the edges of the die. Shorting and sagging can be caused when wires are jarred or pushed into contact with each other. For instance, during molding, when the mold compound enters a mold and flows over the die and the bond wires, the flow or movement of the mold compound can move the wires into contact with each other. This phenomenon is known as mold sweep. Thus, with longer wires, greater wire density, and smaller wire diameter, wire sweep issues are exacerbated.

One way to combat wire shorting due to wire sweep is to use insulated wires. However, insulated wires are more expensive than bare wires and can be more difficult to bond to either the die bonding pads or the package pads (e.g., lead frame lead tips) due to the insulation on the tip of the wires compromising or weakening the bonds. Another solution to wire sweep is to coat the bond wires before molding with a liquid epoxy resin. However, the coating on the wires can become brittle and crack when the package is subjected to cyclic temperature testing.

Thus, it would be desirable to have a structure for preventing wire sweep during semiconductor device packaging.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention. For example, the size and dimensions of some elements have been exaggerated for ease of understanding and explanation.

DETAILED DESCRIPTION OF THE INVENTION

Figure 1:
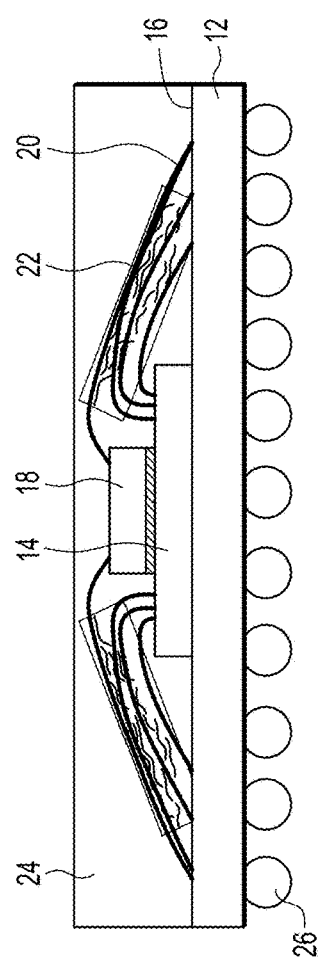
FIG. 1 is an enlarged cross-sectional side view of a packaged semiconductor device in accordance with an embodiment of the present invention.

The detailed description set forth below in connection with the appended drawings is intended as a description of a presently preferred embodiment of the invention and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

In one embodiment, the present invention provides a packaged semiconductor device, including a substrate, at least one semiconductor die, a plurality of bond wires and a bond-wire reinforcement structure. The die is mounted on a top surface of the substrate and the bond wires electrically connect die bonding pads on an active surface of the die to respective I/O pads of the substrate. The bond-wire reinforcement structure is formed over the bond wires and prevents the bond wires from moving or shorting with other bond wires. In one embodiment, a molding compound is formed over the bond wires, the bond-wire reinforcement structure, the active surface of the die, and the top surface of the substrate.

In another embodiment, the present invention provides a method of assembling a semiconductor device that includes a bond-wire reinforcement structure. The method includes the steps of attaching a passive side of a semiconductor die to a substrate and electrically connecting die bonding pads on an active side of the semiconductor die to I/O pads of the substrate with bond wires. Next, a fibrous reinforcement structure is formed over the bond wires. The reinforcement structure prevents the wires from excessive movement, which could cause shorting. In one embodiment, the die, the reinforcement structure and the bond wires are covered with a molding compound.

Referring now to FIG. 1, an enlarged, cross-sectional side view of one embodiment of a packaged semiconductor device 10 in accordance with an embodiment of the present invention is shown. The device 10 includes a substrate 12 and at least one integrated circuit die 14 mounted on a top surface 16 of the substrate 12. The substrate 12 may comprise a multi-layer wiring board or a metal lead frame, both of which are known in the art. In some embodiments, the packaged device 10 may include one or more additional dies, such as additional die 18 that is on top of the die 14. The die 14 may be any type of die, that includes circuitry for performing predetermined operations, such as a microcontroller, a processor, a mixed signal circuit, a sensor circuit, etc., and the same for any additional dies, like the die 18. The die 14 typically is rectangular and has a top, active surface, an opposing bottom, passive surface, and four lateral side surfaces that extend between the top and bottom surfaces.

The die 14 may be attached to the top surface 16 of the substrate 12 (or to a flag of a lead frame) with a die attach epoxy or a tape, as is known in the art. The second die 18, if included, may be similarly attached to the top surface of the first die 14.

The die 14 is electrically connected to the substrate 12 with bond wires 20. More particularly, bonding pads on the active surface of the die 14 are electrically connected with corresponding substrate bonding pads with the bond wires 20. In one embodiment, the bond wires comprise bare copper wires. However, other electrically conductive wires may be used instead, such as gold or silver wires, and the wires may be plated or unplated. It should be understood by those of skill in the art that the invention is not limited by the composition of the wires used, nor the particular size of the wires, e.g., wire diameter. If there is a second die, like the die 18, then the second die 18 also is electrically connected to the substrate 12 with bond wires. If the substrate 12 comprises a lead frame, then the bond wires 20 extend from the die bonding pads to bonding sites on leads of the lead frame (typically inner lead tips). In some multi-die packages, the bottom die may be a flip-chip die that is electrically connected to the substrate with bumps instead of bond wires, while the top die is electrically connected to the substrate with bond wires.

A bond-wire reinforcement structure 22 is formed over the bond wires 20. The bond-wire reinforcement structure 22 comprises a woven mat formed with a non-electrically conductive material. In one embodiment, the bond-wire reinforcement structure 22 comprises a woven fiberglass mat or a cellulose nanofiber mat. The bond-wire reinforcement structure 22 also comprises an epoxy resin formed over the bond wires 20. The bond-wire reinforcement structure 22 is sized and shaped to fit over the bond wires 20.

Figure 2B:
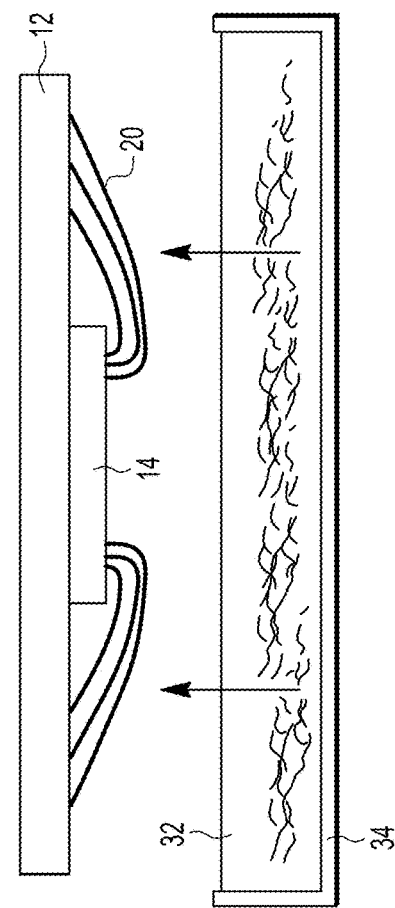
FIG. 2B is an enlarged cross-sectional side view illustrating another method of forming a bond wire reinforcement structure in accordance with an embodiment of the present invention.
Figure 2A:
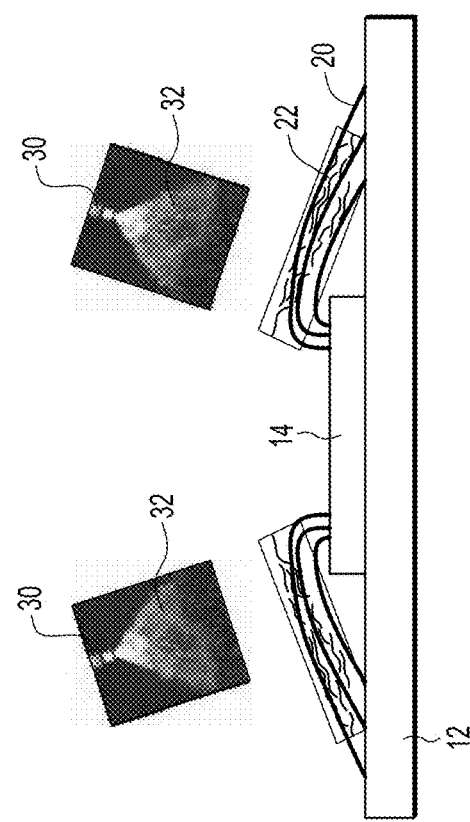
FIG. 2A is an enlarged cross-sectional side view illustrating a method of forming a bond wire reinforcement structure in accordance with an embodiment of the present invention.

FIG. 2A illustrates a first method of forming the fibrous reinforcement structure 22 over the bond wires 20. In this embodiment, a liquid form of the reinforcement structure 22 is sprayed with nozzles 30 onto the bond wires 20. More specifically, a premixture 32 of a fibrous substance with epoxy resin is formed, and then the premixture 32 is sprayed over and onto the bond wires 20 using the spray nozzles 30. In one embodiment, the fibrous substance comprises cellulose nanofibers. In another embodiment, the fibrous substance comprises glass fibers.

In another embodiment, as shown in FIG. 2B, the premixture 32 is applied to the bond wires 20 by dipping the assembly (substrate, die and bond wires) into a tray 34 of the premixture 32, such as by inverting the assembly and then dipping it into the tray 34 of premixture 32. In this embodiment, the die 14 also may be covered or partially covered with the premixture 32.

After applying the premixture 32 to the bond wires 20, the premixture 32 is cured so that it hardens, such that it holds the bond wires 20 in place so that they will not be subject to wire sweep later when a molding process is performed.

Figure 2C:
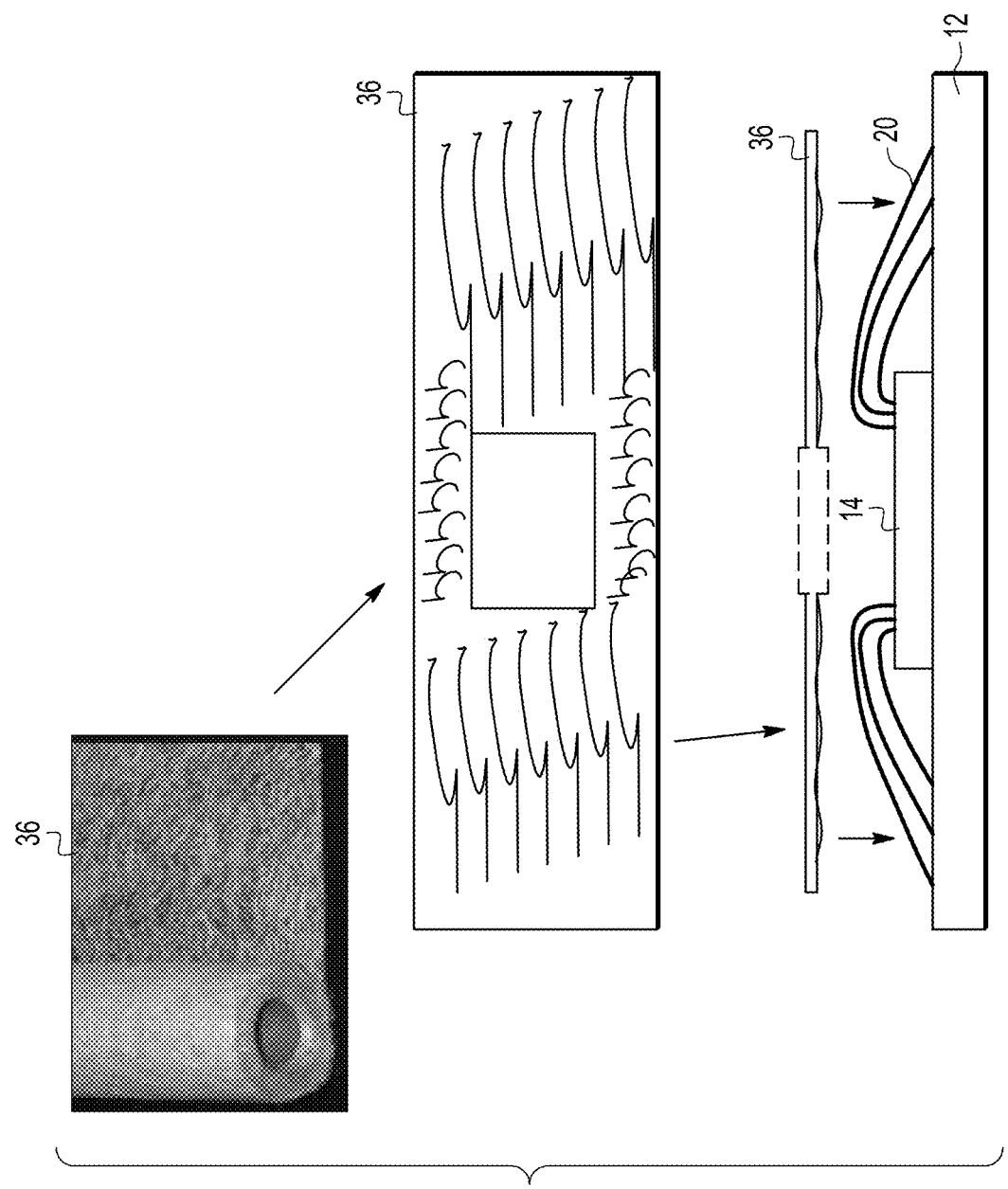
FIG. 2C is an enlarged cross-sectional side view illustrating yet another method of forming a bond wire reinforcement structure in accordance with an embodiment of the present invention.

Referring to FIG. 2C, an alternative method of forming the reinforcement structure over the bond wires 20 is illustrated. In this embodiment, forming the fibrous reinforcement structure over the bond wires comprises placing a mat 36 formed with a non-electrically conductive fibrous material over the bond wires 20 and then dispensing a liquid epoxy onto the fiber mat 36. The liquid epoxy may be dispensed onto the mat 36 with spray nozzles, as shown in FIG. 2A, or by other methods, such as with a syringe type dispensing device (not shown). The liquid epoxy wets the fiber mat 36 such that the fibrous material forms itself over and around the wires 20. Then the wet composition is cured, such that the fibers maintain the bond wires 20 in a stationary position during an ensuing encapsulating step.

The mat preferably is sized and shaped to cover the bond wires 20. In a presently preferred embodiment, the mat 36 includes a center cut-out so that the mat 36 does not cover the central top surface of the die 14 (and/or 18). The reason for the center cut-out is to prevent air bubbles from getting trapped under the mat 36.

Referring again to FIG. 1, in a presently preferred embodiment, the packaged semiconductor device 10 also includes a molding compound 24 formed over the bond wires 20, the bond-wire reinforcement structure 22, the top surface of the die 14 (and/or die 18), and the top surface 16 of the substrate 12. The molding compound 24 protects the die 18 and the wires 20 from being contaminated or damaged, such as by exposure to the environment.

Encapsulation processes are well known. One common method used in semiconductor device assembly is transfer molding, which allows for the molding of small and complex components. Transfer molding includes two basic stages. First, the assembly to be encapsulated is placed into a mold cavity, and then the molding compound 24, which has been put into a liquid form by heating, is forced into the cavity. The molding compound 24 then is allowed to solidify, thereby forming the packaged device 10. During the molding process, wire sweep is prevented by the bond-wire reinforcement structure 22.

In one embodiment, the bond-wire reinforcement structure 22, as discussed above, comprises an epoxy-resin and a fibrous material. In a presently preferred embodiment, the molding compound 24 comprises the same material as the epoxy-resin used to form the bond-wire reinforcement structure 22. This allows the materials to mix and so when hardened, there is no CTE mismatch between the materials. If fibrous mat 36 is used, the fibers may comprise glass fibers formed of Silica (Si) and compound fillers also formed with Silica. The composition of the epoxy-resin then can be adjusted to prevent stress caused by material mismatches. With the spray and dip process (FIGS. 2A and 2B), it is preferred to have a minimum amount of coating on the bond wires.

To avoid mold void trap, vacuum molding may be used to remove air during cavity filling.

In the embodiment shown in FIG. 1, conductive balls 26 are attached to a bottom surface of the substrate 12. The conductive balls 26, as will be understood by those of skill in the art, are attached to substrate pads (not shown), which are electrically connected to pads on the opposing side of the substrate to which the bond wires 20 are attached, such that the conductive balls 26 allows for electrical connection to the dies 14 and 18. For a lead frame based package (i.e., the substrate 12 comprises a lead frame), then there is no need for the conductive balls 26, as external ends of the leads are exposed for enabling electrical connection to the dies 14 and 18.

As is evident from the foregoing discussion, the present invention provides a semiconductor device and a method of assembling the semiconductor device. The invention mitigates wire sweep and wire shorts and facilitates very fine pitch requirements. Thus, more complicated and complex wire layouts for higher I/O devices is possible, and longer wires also may be used. The present invention allows for higher wire count, higher wire density, and smaller diameter wires. There also is less chance for foreign matter entrapment between wires because the wires are surrounded by the reinforcement structure.

In addition, the package structure eliminates the need for package level burn-in and cold/hot test, which can significantly reduce assembly and test costs and reduce cycle time. The present invention reinforces a conformal wire coating to achieve good sealing and insulation for wires.

The description of the preferred embodiments of the present invention have been presented for purposes of illustration and description but are not intended to be exhaustive or to limit the invention to the forms disclosed.

It will be appreciated by those skilled in the art that changes could be made to the embodiments described above without departing from the broad inventive concept thereof. It is understood, therefore, that this invention is not limited to the particular embodiments disclosed but covers modifications within the spirit and scope of the present invention as defined by the appended claims.

The invention claimed is:

1. A packaged semiconductor device, comprising:
   a substrate having a plurality of input/output (I/O) pads;
   a semiconductor die having a top, active surface, and a bottom, passive surface, wherein the bottom surface of the die is attached to a top surface of the substrate;
   a plurality of bond wires electrically connecting die bonding pads on the die active surface to respective ones of the substrate I/O pads;
   a fibrous bond-wire reinforcement structure formed over the bond wires and in contact with the bond wires; and
   a molding compound formed over the bond wires, the fibrous bond-wire reinforcement structure, the top surface of the die, and the top surface of the substrate;
   wherein the fibrous bond-wire reinforcement structure comprises a woven mat formed with a non-electrically conductive material.

2. The packaged semiconductor device of claim 1, wherein the fibrous bond-wire reinforcement structure comprises a woven fiberglass mat.

3. The packaged semiconductor device of claim 1, wherein the fibrous bond-wire reinforcement structure comprises a cellulose nanofiber mat.

4. The packaged semiconductor device of claim 1, wherein the fibrous bond-wire reinforcement structure further comprises an epoxy resin formed over the bond wires.

5. The packaged semiconductor device of claim 1, wherein the fibrous bond-wire reinforcement structure is sized and shaped to fit over the bond wires.

6. The packaged semiconductor device of claim 1, wherein at least a portion of each of the substrate I/O pads is exposed from the molding compound to allow for external electrical connection to the semiconductor die.

7. The packaged semiconductor device of claim 1, wherein the substrate comprises a metal lead frame.

8. The packaged semiconductor device of claim 1, wherein the semiconductor die comprises at least two semiconductor dies electrically connected to the substrate with bond wires.

9. The packaged semiconductor device of claim 8, wherein one of the at least two dies is stacked on top of another of the at least two dies.

10. A packaged semiconductor device, comprising:
    a substrate having a plurality of input/output (I/O) pads;
    a semiconductor die having a top, active surface, and a bottom, passive surface, wherein the bottom surface of the die is attached to a top surface of the substrate;
    a plurality of bond wires electrically connecting die bonding pads on the die active surface to respective ones of the substrate I/O pads;
    a fibrous bond-wire reinforcement structure formed over the bond wires and in contact with the bond wires; and
    a molding compound formed over the bond wires, the fibrous bond-wire reinforcement structure, the top surface of the die, and the top surface of the substrate;
    wherein the wherein the fibrous bond-wire reinforcement structure comprises cellulose nanofibers.

11. The packaged semiconductor device of claim 10, wherein at least a portion of each of the substrate I/O pads is exposed from the molding compound to allow for external electrical connection to the semiconductor die.

12. The packaged semiconductor device of claim 10, wherein the substrate comprises a metal lead frame.

13. The packaged semiconductor device of claim 10, wherein the semiconductor die comprises at least two semiconductor dies electrically connected to the substrate with bond wires.

14. The packaged semiconductor device of claim 13, wherein one of the at least two dies is stacked on top of another of the at least two dies.

15. The packaged semiconductor device of claim 10, wherein the fibrous bond-wire reinforcement structure is sized and shaped to fit over the bond wires.

* * * * *